(12) United States Patent
Cosand

(10) Patent No.: US 6,999,019 B2
(45) Date of Patent: Feb. 14, 2006

(54) SUBRANGING ANALOG-TO-DIGITAL CONVERTER WITH INTEGRATING SAMPLE-AND-HOLD

(75) Inventor: Albert E. Cosand, Agoura Hills, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/821,376

(22) Filed: Apr. 8, 2004

(65) Prior Publication Data

US 2005/0225468 A1    Oct. 13, 2005

(51) Int. Cl.
H03M 1/12    (2006.01)
H03M 1/00    (2006.01)

(52) U.S. Cl. ..................... 341/156; 341/122
(58) Field of Classification Search ............ 341/122, 341/143, 156, 118, 120; 327/75
See application file for complete search history.

(56) References Cited

U.S. PATENT DOCUMENTS

| 4,686,511 | A | * | 8/1987 | Koen .................... 341/118 |
| 4,733,217 | A | * | 3/1988 | Dingwall ................... 341/122 |
| 4,763,107 | A | * | 8/1988 | Koen et al. ................ 341/156 |
| 5,070,332 | A | * | 12/1991 | Kaller et al. ............... 341/156 |
| 5,099,240 | A | * | 3/1992 | Nakatani et al. ........... 341/156 |
| 5,302,869 | A | * | 4/1994 | Hosotani et al. ............ 327/75 |
| 5,353,027 | A | * | 10/1994 | Vorenkamp et al. ........ 341/156 |
| 5,489,904 | A | * | 2/1996 | Hadidi ...................... 341/156 |
| 5,739,781 | A | * | 4/1998 | Kagey ...................... 341/155 |
| 6,121,912 | A | * | 9/2000 | Brandt ...................... 341/156 |
| 6,580,383 | B1 | * | 6/2003 | Devendorf et al. ......... 341/143 |
| 6,583,747 | B1 | * | 6/2003 | van der Goes et al. ..... 341/156 |

* cited by examiner

Primary Examiner—Patrick Wamsley
(74) Attorney, Agent, or Firm—Jonathan W. Hallman; MacPherson Kwok Chen & Heid

(57) ABSTRACT

A subranging analog-to-digital converter (ADC) includes an integrating sample-and-hold circuit. The integrating sample-and-hold circuit is configured to sample an input voltage by charging at least one capacitor by coupling a current proportional to the input voltage to the at least one capacitor. A coarsely-quantizing ADC is configured to convert the voltage on the at least one capacitor to a digitized value. A digital-to-analog converter is configured to convert the digitized value to an analog voltage. A finely-quantizing ADC is configured to convert the difference between the analog voltage and the voltage on the charged at least one capacitor in the integrating sample-and-hold circuit to another digitized value.

20 Claims, 5 Drawing Sheets

SUBRANGING ANALOG-TO-DIGITAL CONVERTER WITH INTEGRATING SAMPLE-AND-HOLD

TECHNICAL FIELD

This invention relates generally to analog-to-digital converters, and more particularly to a subranging analog-to-digital converter with integrating sample-and-hold.

BACKGROUND

A number of architectures exist for high-speed analog-to-digital (A/D) converters. For example, flash A/D converters use a plurality of components such as comparators that act in parallel to convert an analog signal into a digitized signal. Because these components all act simultaneously, flash A/D converters can achieve relatively high processing speeds. However, the number of comparators required for a flash A/D goes up exponentially with the bit size—e.g., a 10-bit flash A/D requires $2^{10}$ (1024) comparators, thereby requiring a relatively large circuit area and accompanying power demands. As an alternative, a pipelined architecture would use just one stage per bit. However, coordinating the pipelining through each stage at high throughput rates becomes problematic.

Subranging A/D converters combine the parallel processing and pipelining features of the two architectures just discussed. A conventional subranging two-stage N-bit A/D converter 100 is shown in FIG. 1. A voltage-switching sample-and-hold circuit samples an input signal voltage $V_{in}$ using a voltage switch driven according to a clock signal. When the voltage switch is closed, the voltage on capacitor C rises to match $V_{in}$. Conversely, when the voltage switch is opened, capacitor C holds the sampled voltage. To prevent loading of the capacitor C that would distort the sampled voltage, a high-impedance buffering amplifier 105 isolates the capacitor C from the remaining components of A/D converter 100 and provides a buffered sample voltage 102.

Sampled voltage 102 is then processed by a first stage and a second stage. The first stage includes a coarse-quantizing A/D converter that receives the sampled voltage from the sample-and-hold circuit to produce a coarsely-digitized signal 110. The coarsely-digitized signal 110 is converted back into an analog voltage 120 in the first stage by a digital-to-analog converter (DAC). The second stage includes an amplifier 110 configured to provide the difference between sampled voltage 102 and analog voltage 120. This difference is digitized in a fine-quantizing A/D converter to provide a digitized version 140 of the difference signal. By combining digitized signals 140 and 110, a digitized voltage sample is provided. The sample rate of this simple two-stage approach is limited by the need to capture a sample, perform the coarse conversion, analog reconstruction, subtraction, and fine conversion all within one sample period. In this fashion, the single sample-and-hold circuit is available to capture the next sample. More complex subranging A/D converter architectures cascade multiple sample-and-hold circuits so that part of the conversion can take place after the converter has begun to acquire the next sample. Although these more complex subranging A/D converter architectures can accommodate higher sampling rates, this accommodation comes at the cost of increased complexity, power dissipation, and loss of accuracy as the sample information is transferred from one sample-and-hold circuit to the next in the cascade.

Although two-stage subranging A/D converter 100 avoids the excessive components necessary in a flash architecture and the excessive pipelining of a pipelined architecture, it too suffers from a number of disadvantages. For example, because the sample-and-hold circuit is directly sampling the input voltage through a voltage switch, it usually requires some type of feedback with respect to the voltage switch to provide adequate input-to-output isolation. This feedback becomes difficult to implement at higher throughput speeds. Moreover, the buffer amplifier must accommodate the entire dynamic range of the input voltage. Designing such a buffer amplifier for high throughput speeds while still maintaining low-noise, low-distortion, and fast settling times becomes problematic.

Accordingly, there is a need in the art for improved subranging A/D converter architectures.

SUMMARY

In accordance with one aspect of the invention, a subranging analog-to-digital converter (ADC) is provided. The subranging ADC includes: a first integrating sample-and-hold circuit configured to sample an input voltage by charging a first capacitor through a first current switch; a first stage having a coarse-quantizing ADC configured to digitize a voltage on the first capacitor to provide a coarsely-digitized output and a DAC configured to convert the coarsely-digitized output into an analog voltage; a second integrating sample-and-hold circuit configured to sample the input voltage by charging a second capacitor through a second current switch; and a second stage configured to receive charge from the charged second capacitor and the analog voltage to provide a voltage difference between the sampled input voltage and the analog voltage, the second stage including a fine-quantizing ADC configured to convert the voltage difference to provide a finely-digitized output. Advantageously, such a sub-ranging ADC provides the voltage difference without the need for a difference amplifier. Furthermore, the use of integrating sample-and-hold circuits provides inherent isolation without the necessity of feedback control.

In accordance with another aspect of the invention, a method is provided. The method includes the acts of: converting an input voltage to a first current; closing a first current switch to couple the first current to a first capacitor to charge the first capacitor; converting the input voltage to a second current; closing a second current switch to couple the second current to a second capacitor to charge the second capacitor; coarsely-quantizing a voltage on the charged first capacitor to provide a coarsely-digitized output; converting the coarsely-digitized output into an analog voltage; transferring the charge from the charged second capacitor to a first terminal of a third capacitor and shifting the voltage of an opposing second terminal of the third capacitor to the negative of the analog voltage to produce a residual voltage at the first terminal of the third capacitor representing a difference between the voltage on the charged first capacitor and the analog voltage; and finely-quantizing the residual voltage to provide a finely-digitized output.

BRIEF DESCRIPTION OF THE DRAWINGS

Embodiments of the present invention and their advantages are best understood by referring to the detailed description that follows. It should be appreciated that like reference numerals are used to identify like elements illustrated in the figures.

DETAILED DESCRIPTION

Figure 1:
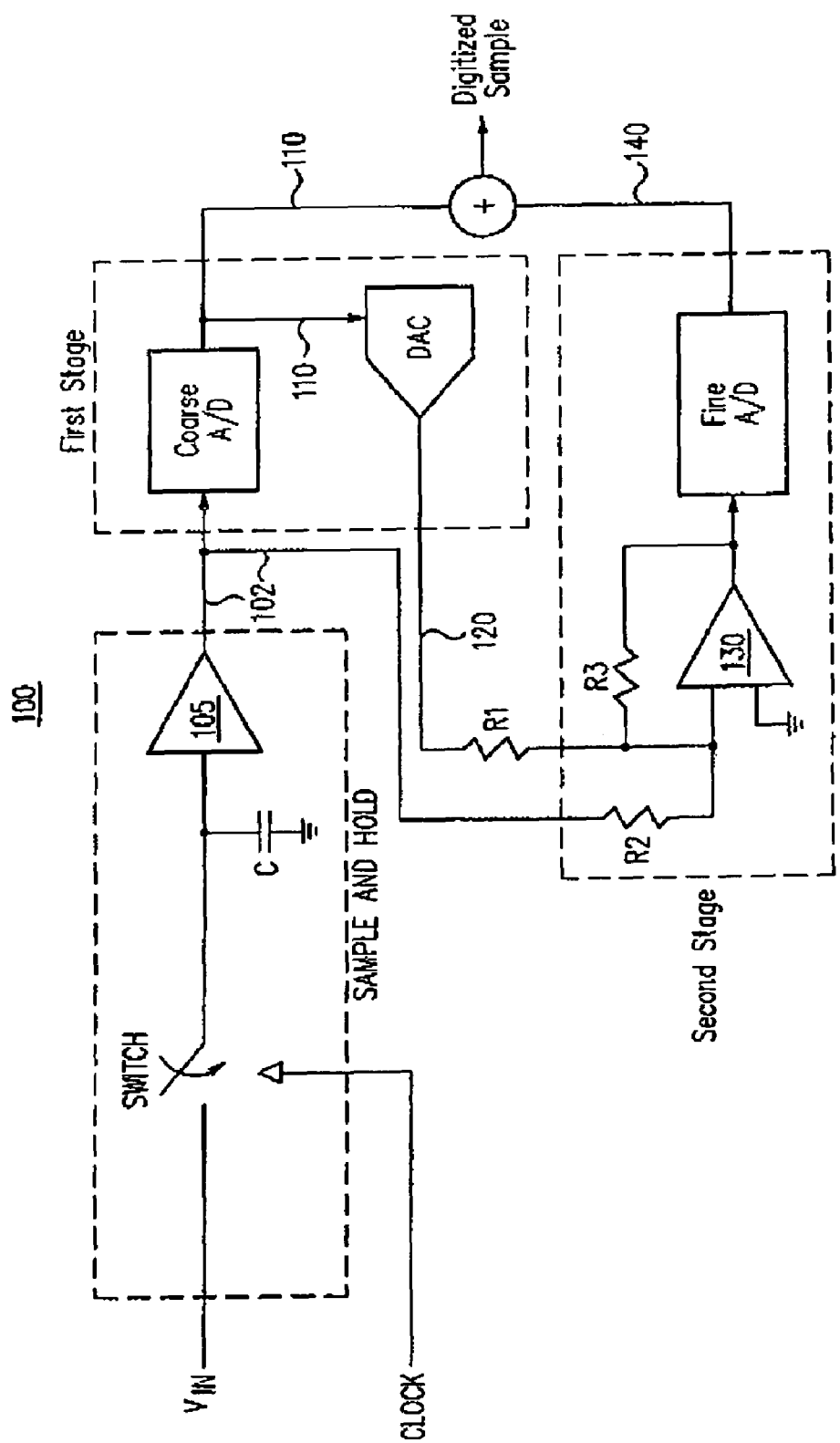
FIG. 1 is a block diagram of a conventional two-stage subranging A/D converter.
Figure 2:
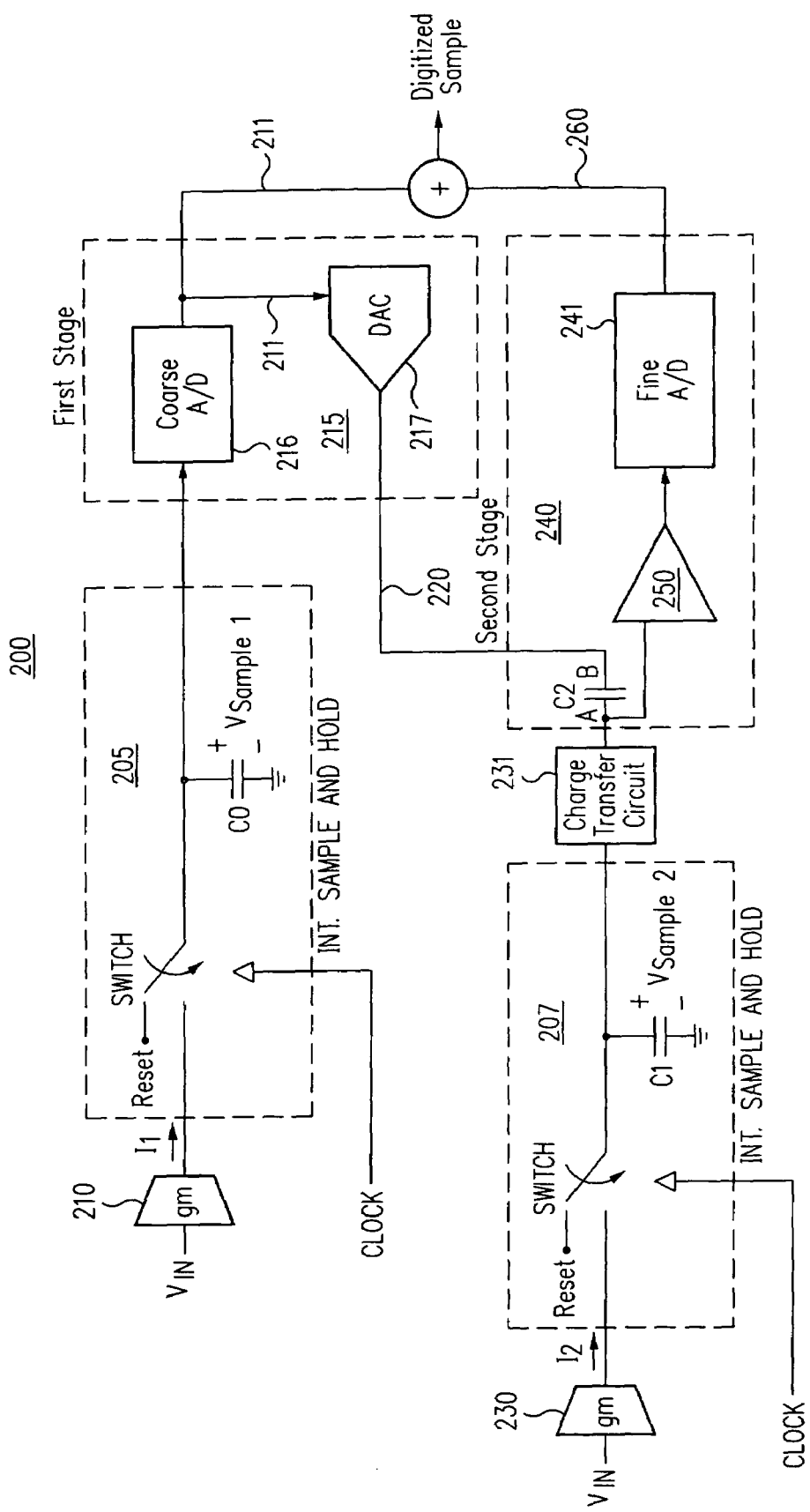
FIG. 2 is a block diagram of a subranging A/D converter according to one embodiment of the invention.

Referring now to FIG. 2, a block diagram for a subranging A/D converter (ADC) 200 in accordance with an embodiment of the present invention is shown. ADC 200 includes an auxiliary integrating sample-and-hold circuit 205 and a main integrating sample-and-hold circuit 207. Auxiliary integrating sample-and-hold circuit 205 receives a current I1 provided by a transconductance circuit 210. Current I1 is proportional to an input voltage $V_{in}$ as determined by the transconductance factor gm implemented in transconductance circuit 210. Sample-and-hold circuit 205 integrates current I1 by closing its current switch to couple current I1 to a capacitor C0. The accumulated charge on capacitor C0 will be retained when the switch is opened. A voltage $V_{sample1}$ across C0 as a result of the stored charge will be proportional to the input voltage $V_{in}$ at a sampling time determined by the period during which the current switch is closed.

A first stage 215 contains a coarse-quantizing ADC 216 that receives $V_{sample1}$ from capacitor C0 and provides a coarsely-digitized version of $V_{sample1}$ 211 to a digital-to-analog converter (DAC) 217 that in turn provides a coarse sample output voltage 220 analogously as discussed with respect to the first stage for conventional subranging ADC 100. Because voltage $V_{sample1}$ held on capacitor C0 need only drive coarse-quantizing ADC 216, this voltage need not have the precision desired for A/D converter 200. Instead, some degradation in $V_{sample1}$ may be tolerated due to loading by coarse-quantizing ADC 216. Accordingly, a relatively simple high-speed buffer (not illustrated) may be used to isolate coarse-quantizing ADC 216 from the voltage $V_{sample1}$ held on capacitor C0. In addition, because of the inherent isolation provided by the use of integrating sample-and-hold 205 as compared to the isolation for conventional voltage-tracking sample-and-hold circuits, the need for feedback control of the current switch in auxiliary sample-and-hold circuit 205 is eliminated.

Main integrating sample-and-hold circuit 207 shares the same advantage in that it too eliminates the need for feedback control of its switch as compared to a voltage-tracking sample-and-hold circuit. Main integrating sample-and-hold circuit 207 receives a current I2 provided by a transconductance circuit 230. Current I2 is proportional to the input voltage $V_{in}$ as determined by the transconductance factor gm implemented in transconductance circuit 230. Sample-and-hold circuit 207 integrates current I2 by closing its current switch to couple current I2 through a capacitor C1. The resulting accumulated charge on capacitor C1 will be retained when the current switch is opened. A voltage $V_{sample2}$ across C1 as a result of the stored charge will be proportional to the input voltage $V_{in}$ at a sampling time determined by the period during which the current switch is closed. The switches for both sample-and-hold circuits 205 and 207 may be synchronized by a clock signal so that the sampling times for $V_{sample1}$ and $V_{sample2}$ are the same. Given this synchronization, note that if the ratio of I2/C2 equals the ratio of I1/C0, the voltage to which capacitors C1 and C0 are charged will be the same.

Rather than use an amplifier to indirectly determine the difference between $V_{sample1}$ and coarse sample voltage 220, subranging ADC 200 performs this operation directly by transferring the charge accumulated on capacitor C1 to a capacitor C2. To begin this operation, capacitor C2 is reset. During this reset, the potential on a terminal B on capacitor C2 equals the coarse voltage output 220 being provided by DAC 217 responsive to a zero digital input. A terminal A for capacitor C2 is then charged by coupling through a charge transfer circuit 231 to capacitor C1. Charge transfer circuit 231 allows the accumulated charge on capacitor C1 to transfer to capacitor C2 while keeping the potentials separate. Denoting the amount of transferred charge from C1 to C2 as Q, the resulting voltage potential between terminal A and an opposing terminal B on capacitor C2 will change by Q/C2, where C2 also represents the capacitance of capacitor C2. DAC 217 is then configured to provide analog coarse sample voltage 220 that equals a digital-to-analog conversion of coarsely-quantized $(-V_{sample1})$ 211. The potential of terminal B thus equals the coarse sample voltage 220. Because the charge on the capacitor C2 is not changed by this potential change at terminal B, a corresponding change must be produced at terminal A. The voltage potential of terminal A with respect to terminal B will then equal Q/C2 minus $V_{sample1}$. As discussed above, the sampling by sample and hold circuits may be synchronized by a clock such that the current switches couples the currents I1 and I2 to capacitors C0 and C1 at the same time and for the same duration. Given this synchronization, if the ratio of I2/C2 equals that of I1/C0, the quantity Q/C2 will equal $V_{sample1}$. Advantageously, the voltage at terminal A will then directly provide the desired quantity: $V_{sample1}$ minus coarsely-quantized $V_{sample1}$. Those of ordinary skill in the art will appreciate that the ratio of I2/C2 need not equal that of I1/C0—if they are not equal, the resulting inequality may be accounted for by adjusting the gain of DAC 217 such that the quantity Q/C2 still represents $V_{sample1}$. Advantageously, the quantity $V_{sample1}$ minus coarsely-quantized $V_{sample1}$ is produced directly by the voltage shift of terminal B of capacitor C2 without requiring a summing or differential amplifier.

The residual voltage at terminal A is received by a buffer amplifier 250 in second stage 240 that in turn provides a buffered output to fine-quantizing ADC 241. A finely-digitized output 260 from fine-quantizing ADC 241 may then be combined with coarsely-digitized output 211 to provide the digitized version of $V_{in}$ having the sampling time determined by the clocking of the switches in sample-and-hold circuits 205 and 207. Coarsely-digitized output 211 represents the first few significant bits whereas finely-digitized output 260 represents the remaining bits down to the least significant bit. Both ADCs 216 and 241 may be constructed as flash ADCs. Alternatively, they may be implemented using, for example, cascaded magnitude amplifiers or any other architecture suitable for a fast, low resolution quantizer.

In contrast to buffer amplifier 105 in conventional subranging ADC 100, buffer amplifier 250 need not accommodate the entire dynamic range of $V_{in}$. Instead, buffer amplifier 250 need only accommodate the substantially smaller dynamic range of the residual voltage on capacitor C2. Moreover, buffer amplifier 250 may have a relaxed settling time in that it need not provide feedback to the current switch in main sample-and-hold circuit 207. In this fashion, the design of buffer amplifier 250 is considerably simplified.

In addition, note that auxiliary sample-and-hold circuit 205 need not have the full accuracy of main sample-and-hold circuit 207 and finely-quantizing ADC 241. Instead, the difference between $V_{sample2}$ from sample-and-hold circuit 240 and the analog reconstruction of $V_{sample1}$ from auxiliary sample-and-hold circuit 205 (analog coarse sample voltage 220) merely needs to fall within the overrange capability of fine-quantizing ADC 241. By relaxing the requirements on auxiliary sample-and-hold circuit 205, subranging ADC 200 allows transconductance circuit 210 to provide less current than transconductance circuit 230, keeping power consumption low. In addition, capacitor C0 may be made smaller than capacitor C1. For clarity of discussion, the previous discussion of subranging ADC 200 did not cover certain implementation issues such as, for example, that capacitors C0, C1, and C2 should be reset after being charged. In addition, the operation of fine-quantizing ADC 241, coarse-quantizing ADC 216, and DAC 217 will need to be synchronized with respect to the sampling period. An implementation of these details may be seen with respect to FIGS. 3 and 4.

Figure 3:
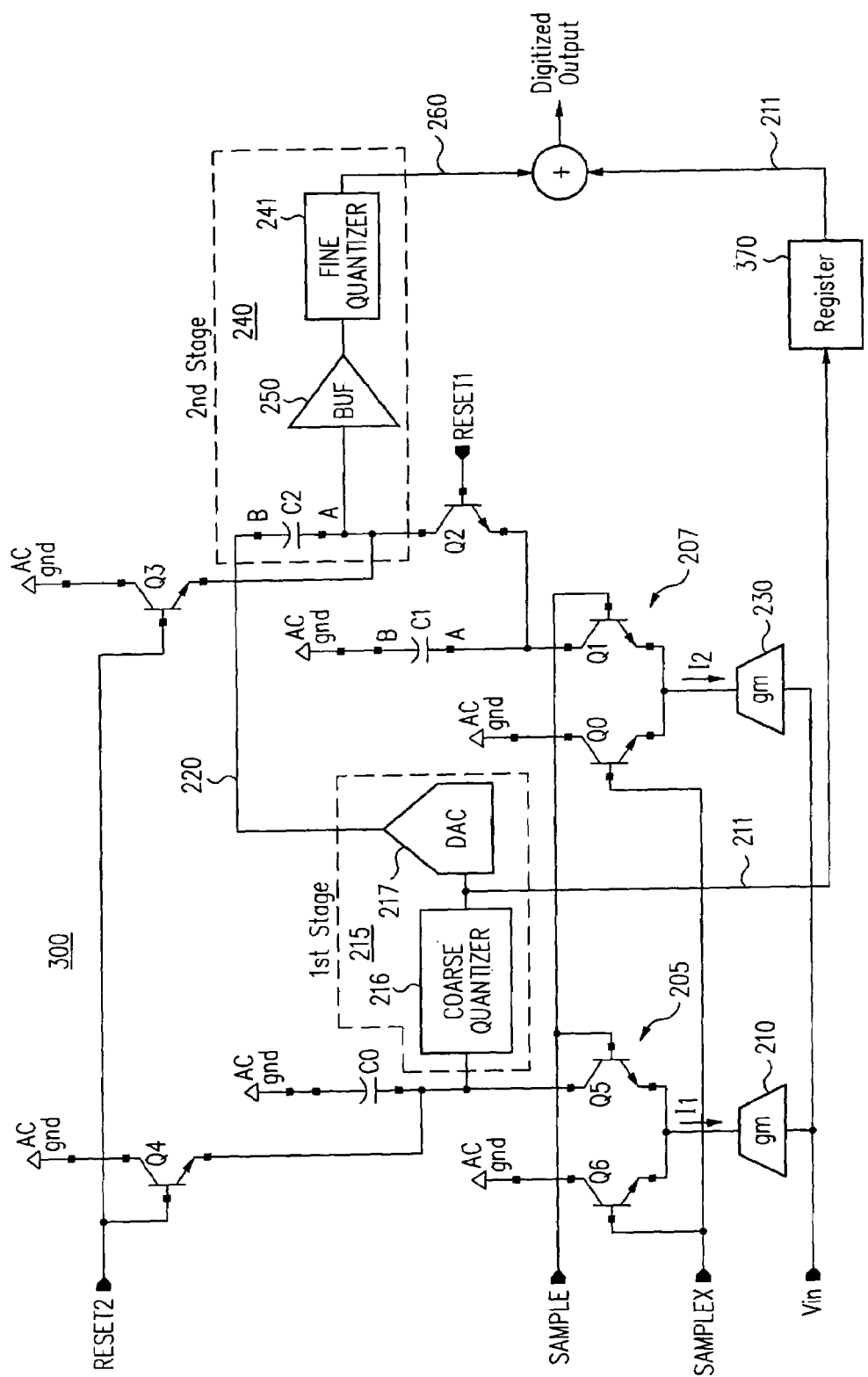
FIG. 3 is a more-detailed schematic illustration of the subranging A/D converter of FIG. 2.
Figure 4:
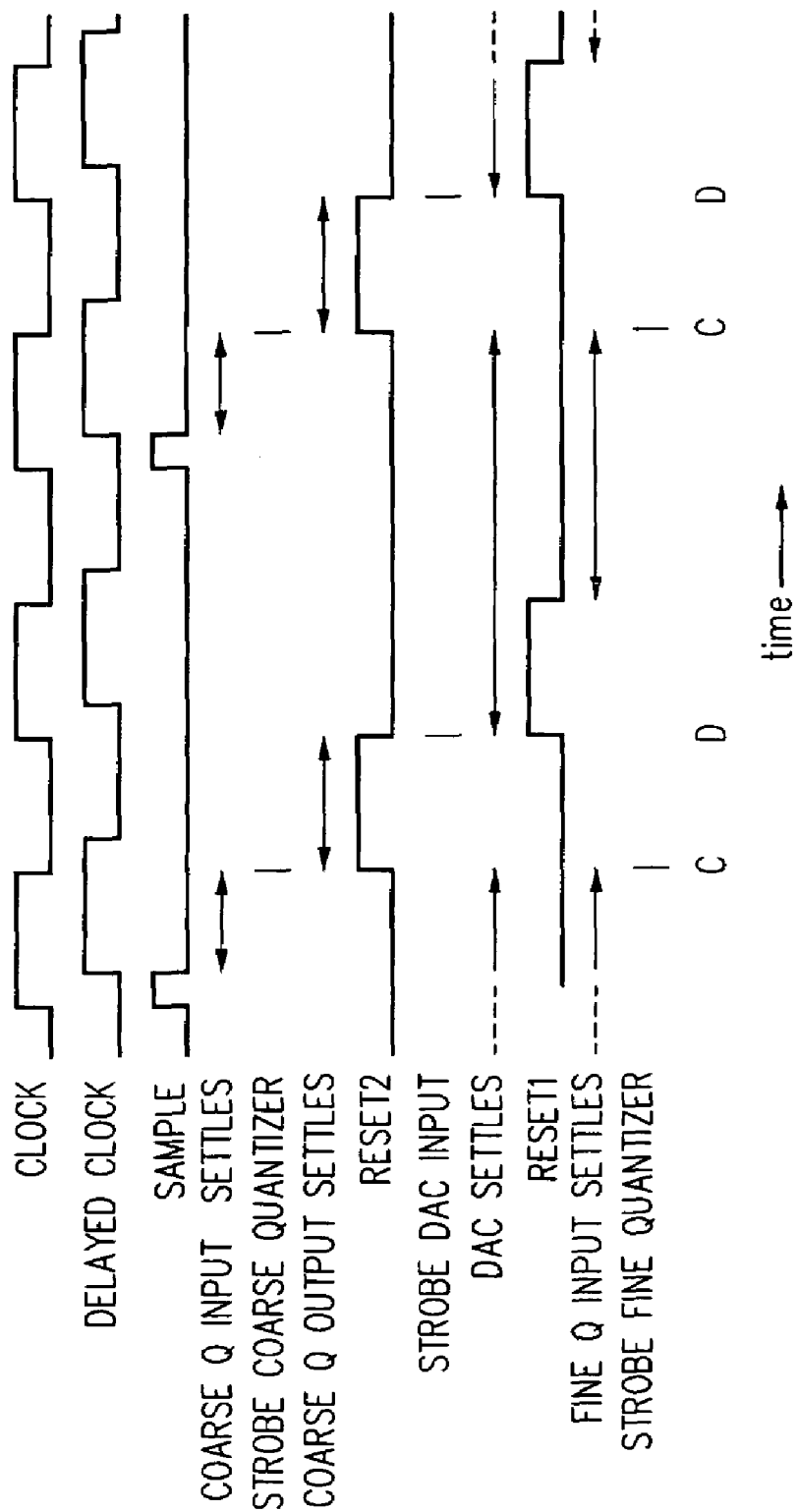
FIG. 4 illustrates the timing relationship for a variety of signals used in the subranging A/D converter of FIG. 3.

FIG. 3 illustrates an exemplary embodiment 300 of subranging ADC 200. Auxiliary sample-and-hold circuit 205 is represented by a differential pair of bipolar transistors Q6 and Q5 and capacitor C0. Transconductance circuit 210 biases this differential pair with current I1. Complementary binary signals sample and samplex couple to the bases of transistors Q5 and Q6, respectively. Depending upon whether sample or samplex is high, current I1 will be conducted virtually entirely by one of transistors Q5 and Q6. Thus, these transistors operate as a current switch. The sample signal is held high during a sampling period for sample-and-hold circuit 205 so that transistor Q5 pulls current I1 from capacitor C0, which in turn couples to an AC ground. During the hold period, the sample signal goes low and signal samplex goes high such that the collector of Q6 pulls current I1 from an AC ground. Thus at the end of the sampling period, capacitor C0 will be charged to a sampling voltage. Coarse-quantizing ADC 216 in first stage 215 receives this sampling voltage and provides coarsely-digitized output 211 to DAC 217 as discussed previously.

The main sample-and-hold circuit 207 may be implemented by using a differential pair of bipolar transistors Q0 and Q1 and capacitor C1. Transistors Q0 and Q1 are also controlled by signals sample and samplex so that they form a current switch for current I2 as provided by transconductance circuit 230. During the sampling period when the sample signal is held high, Q1 will be conducting so that current I1 is drawn from capacitor C1 through a terminal A. Capacitor C1 thus gets charged with a sampling voltage. The emitter of a bipolar transistor Q2 couples to the collector of Q1 so the voltage on capacitor C1 may be reset when transistor Q2 is conducting as determined by the state of a reset signal RESET1. When RESET1 is asserted, capacitor C1 discharges through Q2 to charge capacitor C2 with charge Q as discussed previously. It will be appreciated that reset will occur when RESET1 is pulled sufficiently high relative to the AC ground grounding capacitor C1 at a terminal B. Alternatively, the reset of capacitor C1 could be accomplished by holding the potential at the base of transistor Q2 fixed and driving terminal B of capacitor C1 to a more negative voltage. As yet another alternative, the reset of capacitor C1 could be accomplished through an appropriate combination of shifting the potentials of terminal B of capacitor C1 and the base of transistor Q2 to produce the desired change in their relative potentials. Terminal B of capacitor C2 is set to a defined voltage when RESET2 is asserted, then shifted by coarse sampling voltage 220 as discussed previously. Second stage 240 contains buffer amplifier 250 and fine-quantizing ADC 241 as also discussed previously.

A pair of bipolar transistors Q4 and Q3 respond to a reset signal RESET2 to reset the voltages on capacitors C0 and C2, respectively. Because coarse-quantizing ADC 216 will settle and provide coarsely-digitized output 211 well before fine-quantizing ADC 241 has settled, a register 370 may hold coarsely-digitized output 211 until it may be combined with finely-digitized output 260 to form the digitized sample. The timing of the various components for ADC 300 is shown in FIG. 3. A clock signal and a delayed version of the clock signal may be combined as shown to produce the sample signal. When the sample signal is thus asserted, capacitors C0 and C1 will be charged as discussed above. After allowing the voltage on C0 to settle, coarse-quantizing ADC 216 and fine-quantizing ADC 241 are strobed at time C. While coarsely-digitized output 211 settles, RESET2 may be asserted to reset the voltages on capacitors C0 and C1. At the same time, coarsely-digitized output 211 settles so that DAC 217 may be strobed at time D. At this point, RESET1 may be asserted to transfer the charge to capacitor C2 as discussed previously. The voltage at terminal A on capacitor C2 may then begin settling until the next strobing time C.

Figure 5:
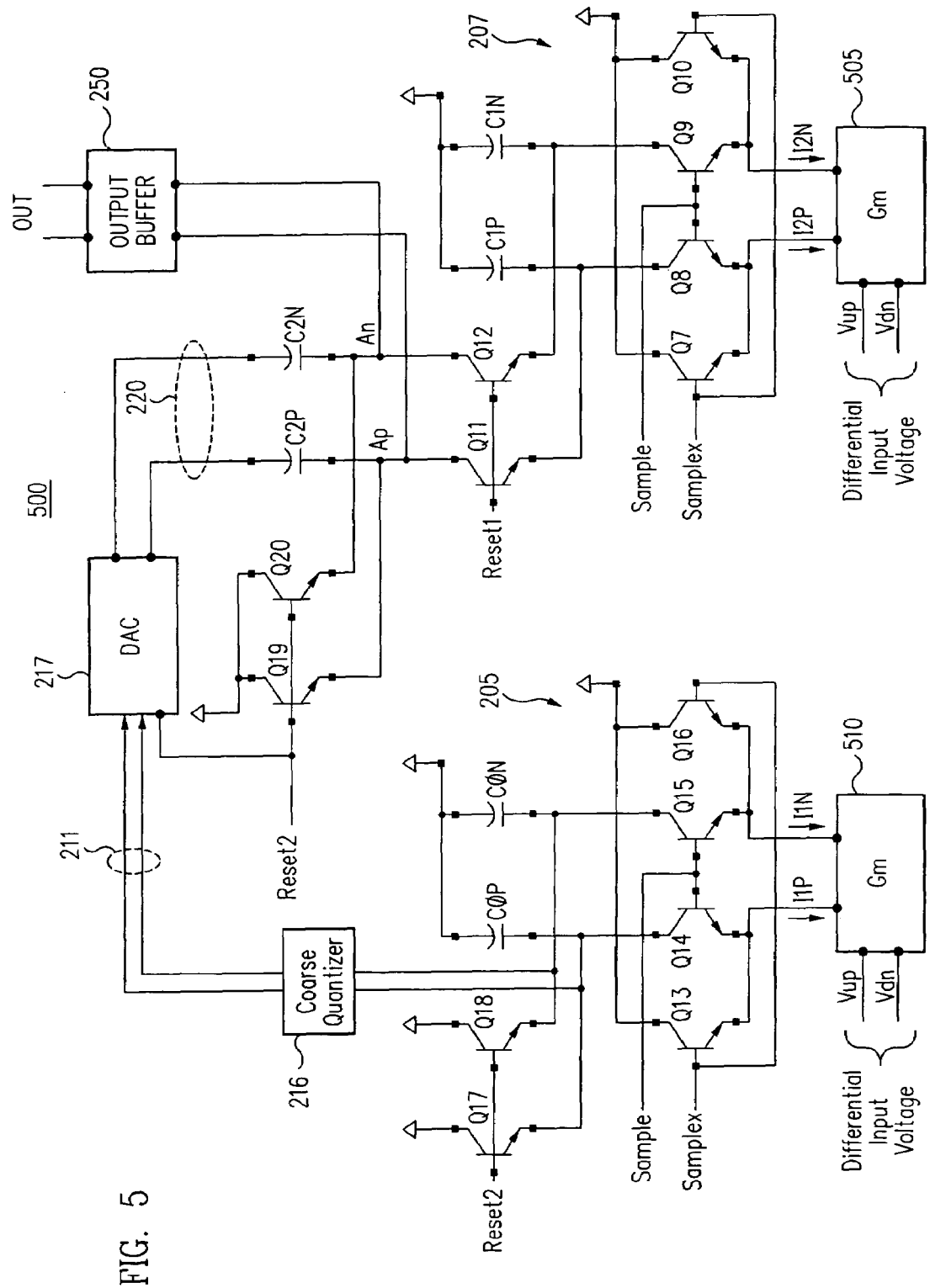
FIG. 5 is a schematic diagram of a double-ended implementation of the subranging A/D converter of FIG. 2.

Those of ordinary skill will appreciate that numerous alternative embodiments for ADC converter 200 may be constructed. For example, the bipolar transistors of ADC converter 300 could be replaced by MOSFETs. In addition, whereas ADC converters 200 and 300 sample Vin in a single-ended fashion, a double-ended sampling (differential mode) could also be performed. In a double-ended embodiment, each capacitor C0, C1, and C2 would comprise two capacitors coupled in series with respect to a differential input voltage; these same capacitors are coupled in parallel with respect to a common-mode voltage as known in the double-ended arts. Turning now to FIG. 5, an exemplary embodiment of a differential subranging ADC 500 is illustrated. Main sample and hold circuit 207 includes a differential current switch formed from two differential pairs of transistors Q7/Q8 and Q9/Q10. Because this ADC 500 is a differential device, the input voltage is represented by a positive component Vup and a negative component Vdn. As is known in the double-ended device arts, input voltage components Vup and Vdn vary in a complementary fashion from a common-mode voltage. A transconductance circuit 505 converts these differential voltage components into differential currents I2p and I2n (the differential analogue of I2 in FIGS. 2 and 3) that vary from a common-mode current in a complementary fashion as well. Current I2p biases transistor pair Q7/Q8 whereas current I2n biases transistor pair Q9/Q10. Both transistor pairs are controlled by the sample and samplex signals as described with respect to FIG. 3. When the sample signal is asserted, capacitors C1p and C1n (the differential analogue of capacitor C1 in FIGS. 2 and 3) will be charged in a complementary fashion with respect to a common-mode voltage.

The auxiliary sample and hold circuit 205 operates analogously. Thus, a transconductance circuit 510 responds to the differential input voltage to provide a complementary set of currents I1p and I1n (the differential analogue to current I1 in FIGS. 2 and 3). These currents bias transistors pairs Q13/Q14 and Q15/Q16, respectively. In turn, these transistor pairs are controlled by the sample and samplex signals. Thus, when the sample signal is asserted, capacitors C0p and C0n (the differential analogue of capacitor C0 in FIGS. 2 and 3) will be charged in a complementary fashion. These capacitors are reset analogously as described to FIG. 3 when signal reset2 is asserted to cause transistors Q17 and Q18 to become conductive. A buffer amplifier (not illustrated) receives the voltages from capacitors C0p and C0n and provides them to coarse quantizer 216, which provides a differential coarse-quantized voltage 211. In turn, DAC 217 converts differential coarse-quantized voltage into differential coarse voltage 220.

The difference between the sampled differential voltage provided by capacitors C0p and C0n and differential coarse-quantized voltage 211 is provided analogously as described with respect to FIG. 3. Thus, a set of capacitors C2p and C2n (the differential analogue to capacitor C2 in FIGS. 2 and 3) are reset when signals reset2 is asserted to cause transistors Q19 and Q20 to become conductive. At the same time, differential voltage 220 is provided by DAC 217 responsive to a zeroed input. The charge from capacitors C1p and C1n may then charge capacitors C2p and C2n, respectively, when signal reset1 is asserted to cause transistors Q11 and Q12 to become conductive. After the charge has been transferred, DAC 217 may provide coarse-quantized voltage 220 responsive to the charge on capacitors C0p and C0n. In this fashion, the difference is directly provided at nodes Ap and An (the differential analogue of node A in FIGS. 2 and 3). Output buffer 250 may then provide this differential voltage to fine quantizer 241 (not illustrated).

Those of ordinary skill in the art will appreciate that many modifications may be made to the embodiments described herein. For example, rather than use bipolar transistors, MOSFETS may be used to implement a subranging ADC according to the principles just described. Accordingly, although the invention has been described with respect to particular embodiments, this description is only an example of the invention's application and should not be taken as a limitation. Consequently, the scope of the invention is set forth in the following claims.

I claim:

1. A subranging analog-to-digital converter (ADC), comprising:
    a first integrating sample-and-hold circuit configured to sample an input voltage by charging a first capacitor through a first current switch;
    a first stage having a coarse-quantizing ADC configured to digitize a voltage on the first capacitor to provide a coarsely-digitized output and a DAC configured to convert the coarsely-digitized output into an analog voltage;
    a second integrating sample-and-hold circuit configured to sample the input voltage by charging a second capacitor through a second current switch; and
    a second stage configured to receive charge from the charged second capacitor and the analog voltage to provide a voltage difference between the sampled input voltage and the analog voltage, the second stage including a fine-quantizing ADC configured to convert the voltage difference to provide a finely-digitized output.

2. The subranging ADC of claim 1, wherein the second stage is configured to provide the voltage difference by comprising a third capacitor having a first terminal and an opposing second terminal, wherein the subranging ADC is configured to couple the first terminal to the charged second capacitor and to couple the opposing second terminal to the complement of the analog voltage such that the first terminal is charged to the voltage difference.

3. The subranging ADC of claim 1, wherein the first integrating sample-and-hold circuit includes a differential pair of transistors configured as a current switch.

4. The subranging ADC of claim 3, further comprising a first transconductance circuit operable to convert the input voltage into the current that is switched by the differential pair of transistors.

5. The subranging ADC of claim 4, wherein the second integrating sample-and-hold circuit includes a differential pair of transistors configured as a current switch.

6. The subranging ADC of claim 5, further comprising a second transconductance circuit operable to convert the input voltage into the current that is switched by the differential pair of transistors in the second integrating sample-and-hold circuit.

7. The subranging ADC of claim 6, wherein a transconductance constant implemented by the second transconductance circuit is greater than a transconductance constant implemented by the first transconductance circuit.

8. The subranging ADC of claim 6, wherein the differential pairs of transistors comprise bipolar transistors.

9. The subranging ADC of claim 2, wherein the second stage further includes a buffer amplifier operable to buffer the voltage difference from the fine-quantizing ADC.

10. The subranging ADC of claim 9, further comprising combining logic operable to combine the finely-digitized output and the coarsely-digitized output to provide a digitized output corresponding to the sampled input voltage.

11. The subranging ADC of claim 10, wherein the subranging ADC is configured to sample the input voltage in a double-ended fashion.

12. The subranging ADC of claim 10, wherein the subranging ADC is configured to sample the input voltage in a single-ended fashion.

13. The subranging ADC of claim 10, further comprising a reset circuit operable to reset the second capacitor while transferring the integrated charge on the second capacitor to the first terminal of the third capacitor.

14. A method of digitizing an input voltage, comprising:
    converting an input voltage to a first current;
    closing a first current switch to couple the first current to a first capacitor to charge the first capacitor;
    converting the input voltage to a second current;
    closing a second current switch to couple the second current to a second capacitor to charge the second capacitor;
    coarsely-quantizing a voltage on the charged first capacitor to provide a coarsely-digitized output;
    converting the coarsely-digitized output into an analog voltage;
    transferring the charge from the charged second capacitor to a first terminal of a third capacitor and shifting the voltage of an opposing second terminal of the third capacitor to the negative of the analog voltage to produce a residual voltage at the first terminal of the third capacitor representing a difference between the voltage on the charged first capacitor and the analog voltage; and
    finely-quantizing the residual voltage to provide a finely-digitized output.

15. The method of claim 14, further comprising combining the finely-digitized output and the coarsely-digitized output to form a digitized output.

16. A subranging ADC, comprising:
    a first integrating sample-and-hold circuit configured to sample an input voltage by charging a first capacitor, the first capacitor being charged by a coupling a first current proportional to the input voltage through at least one differential pair of transistors configured as a switch for the first current;

a coarsely-quantizing ADC configured to convert a voltage on the charged first capacitor to a coarsely-digitized output;

a DAC configured to convert the coarsely-digitized output to an analog voltage;

means for determining a residual voltage equaling the difference between the analog voltage and the voltage on the charged first capacitor; and a finely-quantizing ADC configured to convert the residual voltage into a finely-quantized output.

17. The subranging ADC of claim 16, further comprising:

a second integrating sample-and-hold circuit configured to sample an input voltage by charging a second capacitor, the second capacitor being charged by a coupling a second current proportional to the input voltage through at least one differential pair of transistors configured as a switch for the second current; and wherein the means includes a third capacitor configured to determine the residual voltage by receiving the charge from the charged second capacitor at a first terminal and by receiving a shift in voltage equal to the complement of the analog voltage at an opposing second terminal.

18. The subranging ADC of claim 17, further comprising:

a first transconductance circuit operable to convert the input voltage into the first current; and a second transconductance circuit operable to convert the input voltage into the second current.

19. The subranging ADC of claim 18, wherein the input voltage is a differential input voltage.

20. The subranging ADC of claim 19, further comprising:

resetting means for resetting the second capacitor, wherein the resetting means is configured to charge the third capacitor and shift the voltage at one terminal of the third capacitor so as to produce the residual voltage on an opposing terminal of the third capacitor while resetting the second capacitor.

* * * * *